(12) United States Patent
Fulford et al.

(10) Patent No.: US 11,527,545 B2
(45) Date of Patent: *Dec. 13, 2022

(54) ARCHITECTURE DESIGN AND PROCESS FOR 3D LOGIC AND 3D MEMORY

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 17/008,015

(22) Filed: Aug. 31, 2020

(65) Prior Publication Data

US 2021/0249430 A1    Aug. 12, 2021

Related U.S. Application Data

(60) Provisional application No. 62/975,324, filed on Feb. 12, 2020.

(51) Int. Cl.
  *H01L 27/11551*    (2017.01)
  *H01L 27/11578*    (2017.01)

(52) U.S. Cl.
  CPC .. *H01L 27/11551* (2013.01); *H01L 27/11578* (2013.01)

(58) Field of Classification Search
  CPC ......... H01L 27/11551; H01L 27/11578; H01L 27/11556; H01L 27/11582
  See application file for complete search history.

(56) References Cited

U.S. PATENT DOCUMENTS

| | | | |
|---|---|---|---|
| 10,283,452 B2 | 5/2019 | Zhu et al. | |
| 10,297,578 B2 | 5/2019 | Tagami et al. | |
| 10,340,247 B2* | 7/2019 | Lin | H01L 25/0657 |
| 10,651,153 B2 | 5/2020 | Fastow et al. | |
| 10,741,527 B2 | 8/2020 | Tagami et al. | |
| 10,867,678 B2 | 12/2020 | Chen et al. | |
| 2018/0261575 A1 | 9/2018 | Tagami et al. | |
| 2019/0043836 A1* | 2/2019 | Fastow | H01L 27/11573 |
| 2019/0088589 A1 | 3/2019 | Zhu et al. | |
| 2019/0244892 A1 | 8/2019 | Zhu et al. | |
| 2019/0244893 A1 | 8/2019 | Zhu et al. | |
| 2019/0312012 A1 | 10/2019 | Tagami et al. | |
| 2020/0027509 A1 | 1/2020 | Chen et al. | |
| 2020/0235098 A1* | 7/2020 | Li | H01L 27/092 |
| 2020/0328176 A1* | 10/2020 | Liu | H01L 24/83 |
| 2020/0328180 A1* | 10/2020 | Cheng | H01L 24/80 |
| 2020/0328186 A1 | 10/2020 | Liu | |

(Continued)

FOREIGN PATENT DOCUMENTS

CN    110192269 A    8/2019

OTHER PUBLICATIONS

International Search Report and Written Opinion dated Mar. 18, 2021 in PCT/US2020/061457, 11 pages.

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

Techniques herein include methods of forming circuits by combining multiple substrates. High voltage devices are fabricated on a first wafer, and low voltage devices and/or memory are then fabricated on a second wafer and/or third wafer.

20 Claims, 22 Drawing Sheets

(56) References Cited

U.S. PATENT DOCUMENTS

| | | |
|---|---|---|
| 2020/0328188 A1 | 10/2020 | Liu et al. |
| 2020/0328190 A1 | 10/2020 | Liu et al. |
| 2020/0350014 A1* | 11/2020 | Liu ................... G11C 11/401 |
| 2020/0350286 A1* | 11/2020 | Cheng ................ H01L 24/80 |
| 2020/0350287 A1 | 11/2020 | Liu |
| 2020/0350291 A1 | 11/2020 | Tagami et al. |
| 2020/0350320 A1 | 11/2020 | Cheng et al. |
| 2020/0350321 A1 | 11/2020 | Cheng et al. |
| 2020/0350322 A1 | 11/2020 | Liu et al. |
| 2021/0375829 A1* | 12/2021 | Or-Bach ............. H01L 23/473 |
| 2021/0407991 A1* | 12/2021 | Or-Bach ............. H01L 23/50 |
| 2022/0013485 A1* | 1/2022 | Or-Bach ............. G11C 29/006 |

* cited by examiner

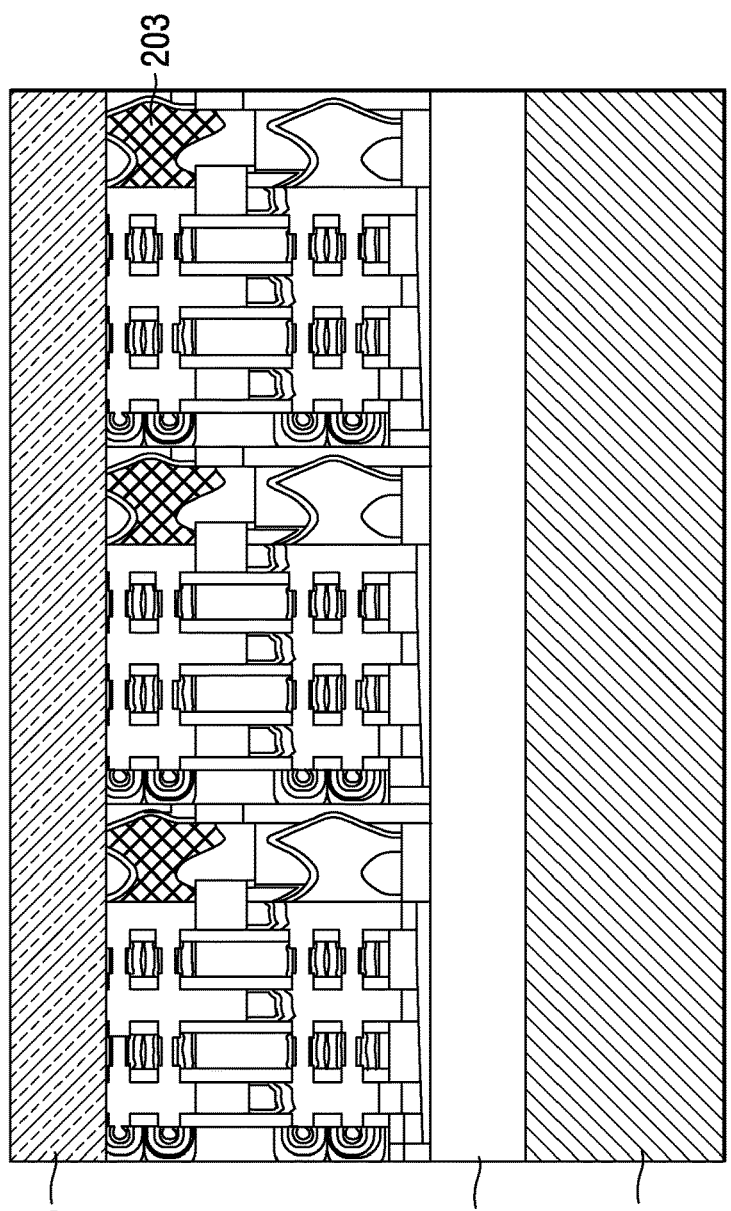
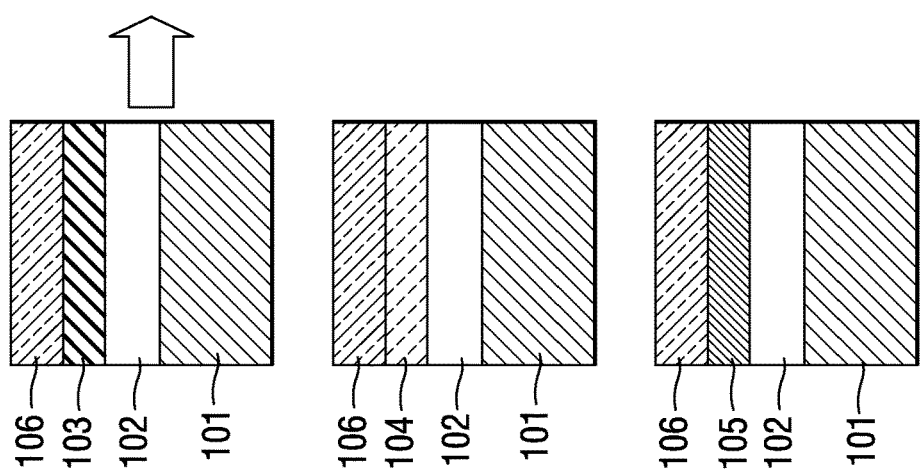
FIG. 15B
FIG. 15A

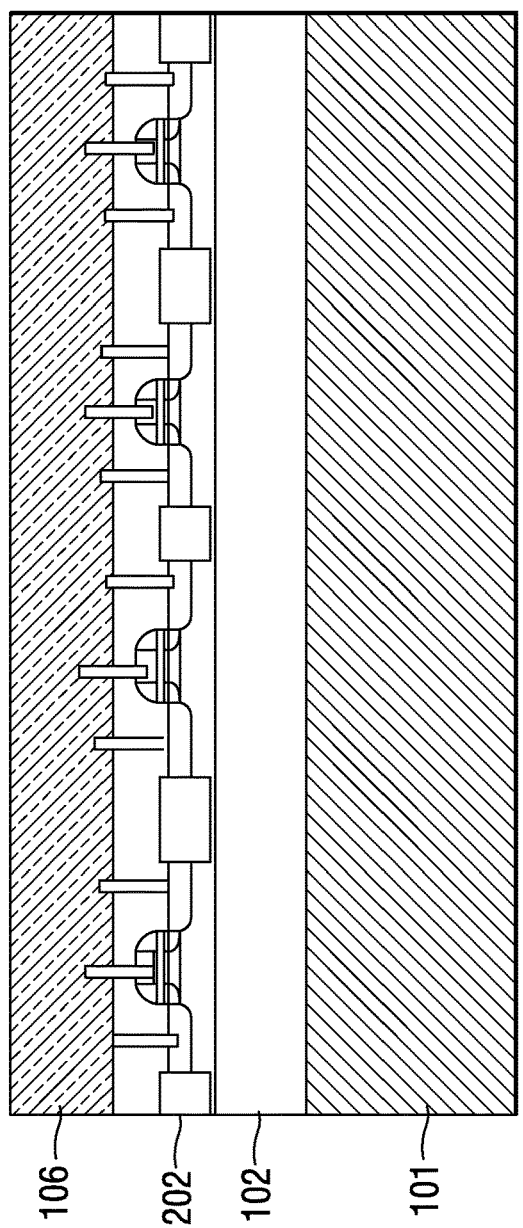
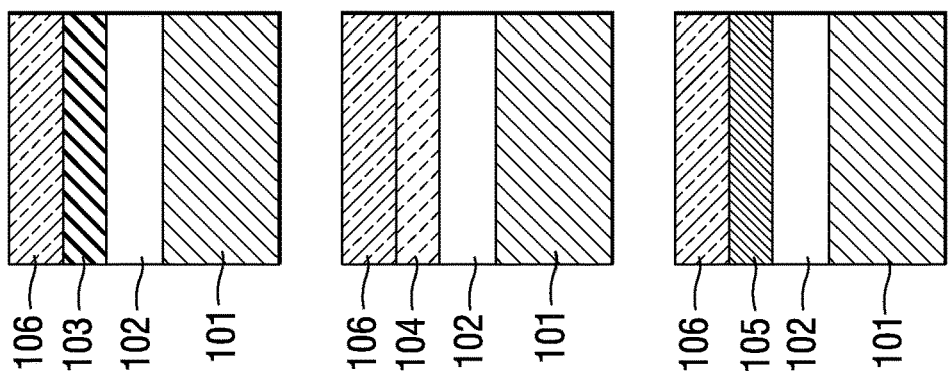
FIG. 16B
FIG. 16A

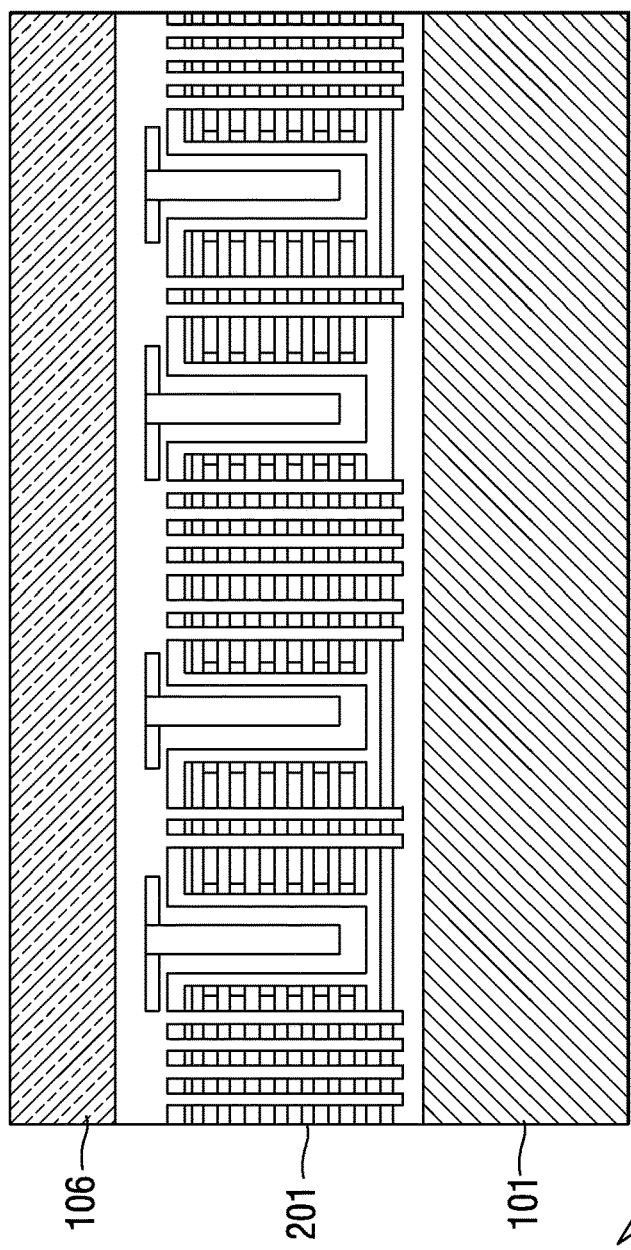
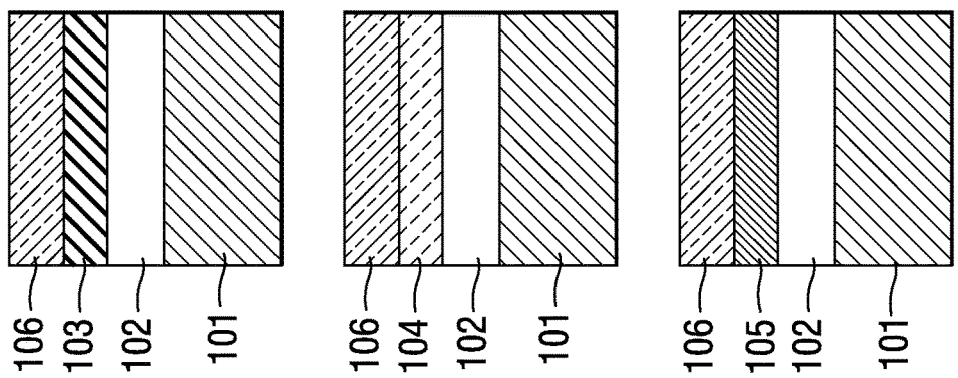
FIG. 17A
FIG. 17B

ARCHITECTURE DESIGN AND PROCESS FOR 3D LOGIC AND 3D MEMORY

CROSS REFERENCE TO RELATED APPLICATIONS

This application is based on and claims the benefit of and priority to U.S. Provisional Patent Application No. 62/975,324, entitled "ARCHITECTURE DESIGN AND PROCESS FOR 3D LOGIC AND 3D MEMORY", filed on Feb. 2, 2020, the entire contents of which are herein incorporated by reference.

BACKGROUND

Technical Field

This disclosure relates to integrated circuits and the fabrication of microelectronic devices, including semiconductor devices, transistors, and integrated circuits. More particularly, it relates to manufacturing of three-dimensional (3D) transistors.

Description of the Related Art

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters into single digit nanometer semiconductor device fabrication. Semiconductor device fabricators have expressed a desire for 3D semiconductor circuits in which transistors are stacked on top of each other.

3D integration is seen as a viable option to continue semiconductor scaling in spite of inevitable saturation in critical dimension scaling. As the contacted gate pitch reaches its scaling limit due to manufacturing variability and electrostatic device limitations, 2D transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns, limit wire pitch scaling, thereby limiting the density with which transistors can be wired into circuits.

3D integration, i.e. the vertical stacking of multiple devices, aims to overcome these scaling limitations by increasing transistor density in volume rather than in area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

SUMMARY

Techniques herein provide a high-performance 3D CMOS device architecture with included 3D memory, as well as 2D planar options combined from multiple substrates, as well as method of fabricating these devices. Stacking of wafers can combine various types of devices. For example, two to three wafers can be combined to provide optimum integration of low-voltage (LV) CMOS, high-voltage (HV) CMOS, and 3D NAND. Other combinations are contemplated.

Combining wafers provides advantages in processing. Because many memory circuits and other circuits rely on HV (greater than 5 to 10V) devices, such devices are best suited to be 2D HV devices to include planar CMOS (N/P), FinFET (N/P). HV devices (both planar and FinFET, for example) can be fabricated on a first wafer. LV devices and/or memory are then fabricated on a second wafer and/or third wafer. Various combinations are possible. By separating processing of LV and HV devices, process optimization can be achieved. For example, some types of devices have different temperature constraints compared to others. Accordingly, when multiple types of devices are fabricated on a single wafer, compromises are made with respect to processing temperatures. Techniques herein integrate any 2D transistor with any 3D device structure. Moreover, 3D and 2D devices on a same transistor plane are optionally executed depending of circuit requirements.

The order of discussion of the different steps as described herein has been presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

This summary section does not specify every embodiment and/or incrementally novel aspect of the present disclosure or claimed features. Instead, this summary only provides a preliminary discussion of different embodiments and corresponding points of novelty over conventional techniques. For additional details and/or possible perspectives of the embodiments, the reader is directed to the Detailed Description section and corresponding figures of the present disclosure as further discussed below.

BRIEF DESCRIPTION OF THE DRAWINGS

The application will be better understood in light of the description which is given in a non-limiting manner, accompanied by the attached drawings in which:

FIGS. 15A-15B show a schematic of three substrates and an LV wafer complete through metal x routing.

FIGS. 16A-16B show a schematic of three substrates and an HV wafer complete through metal x routing FIGS. 17A-17B show a schematic of three substrates and a memory device complete through metal x routing

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Techniques herein include methods of forming integrated circuits by combining multiple substrates. Each substrate can be processed/fabricated simultaneously and with processing parameters (such as temperature) optimized for respective devices being fabricated on each substrate. For example, 3D DRAM and 3D NAND circuits have HV devices, LV devices, logic elements, and memory cell elements. Techniques herein combine different substrates to get the maximum performance from each circuit block. One aspect of method presented herein shows how a 3D NAND may be optimized by bonding wafers. Also covered is integration of existing 2D devices used for HV in 3D NAND to include 2D HV devices to include planar CMOS (N/P), FinFET (N/P), nano sheet side-by-side (N/P) (lateral gate-all-around devices).

Bonding techniques and process flow herein can include those described in U.S. Ser. No. 62/901,591, entitled "High Density Logic And Memory Formation For Advanced Circuit Architecture" filed on Sep. 17, 2019, as well as U.S. Ser. No. 16/592,519 entitled "Method of Making Multiple Nano layer transistors to enhance a multiple stack CFET performance" filed on Oct. 3, 2019, both of which are hereby incorporated by reference in their entirety.

Example embodiments herein will be described with reference to the accompanying drawings. Embodiments will show a process flow for using an HV wafer, a LV wafer and a memory device wafer that are integrated together.

Figure 1:
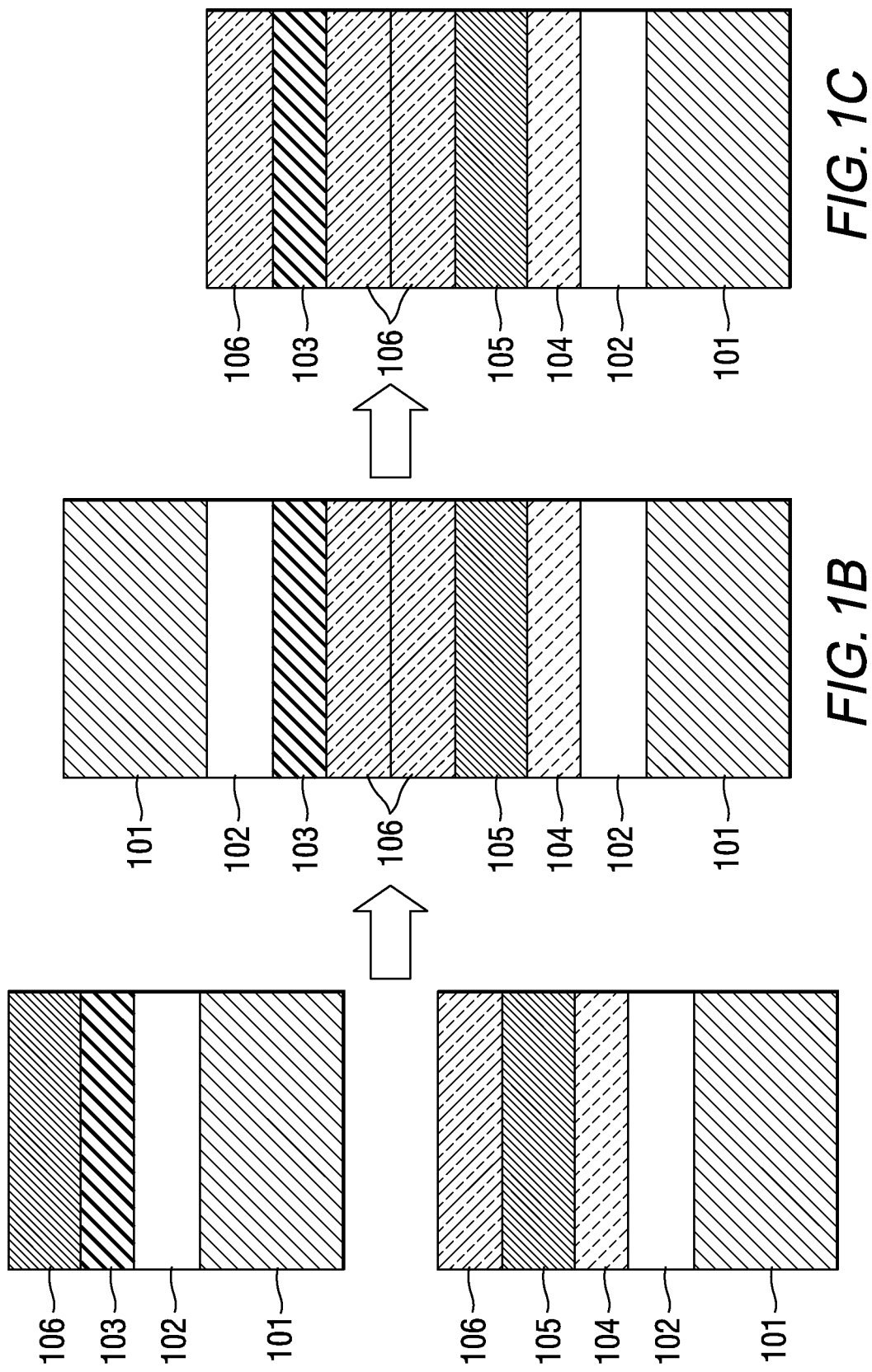
FIGS. 1A-1C show a schematic of a flow process of combining two substrates

In FIGS. 1A to 1C, two substrates are combined, each substrate having oxide beneath HV and LV devices. In FIG. 1A, the upper substrate 101 has a dielectric 102 (such as silicon oxide) deposited on bulk substrate material (such as silicon). On the dielectric 102, a plane of low-voltage devices 103 is fabricated. Note that the plane of LV devices 103 can include 3D devices, stacked devices, lateral gate-all-around devices, and so forth. On the plane of LV devices 103, a wiring plane 106 is formed. This wiring plane 106 (Metal X routing) can have one or multiple wiring levels. Wiring structures herein can be formed with conventional processes such as depositing oxide, using a photo mask to etch trenches and vias, completing a dual damascene metal fill, polishing over burden, adding contacts. The lower substrate 101 of FIG. 1A has HV devices 104 formed over the dielectric 102 on the substrate 101. Then memory devices 105 can be formed on the HV devices 104, followed by a wiring plane 106 on this lower substrate 101.

In FIG. 1B, the two substrates are aligned and joined at their respective metal wiring layers. Accordingly, one substrate is essentially flipped to make this alignment. After the substrates are bonded, the bulk material on one of the substrates can be grinded or polished until reaching the dielectric. Then a third wiring plane can be formed in this dielectric (FIG. 1C). Accordingly, a combined substrate is generated, and additional wiring and fabrication steps can be executed.

Figure 2:
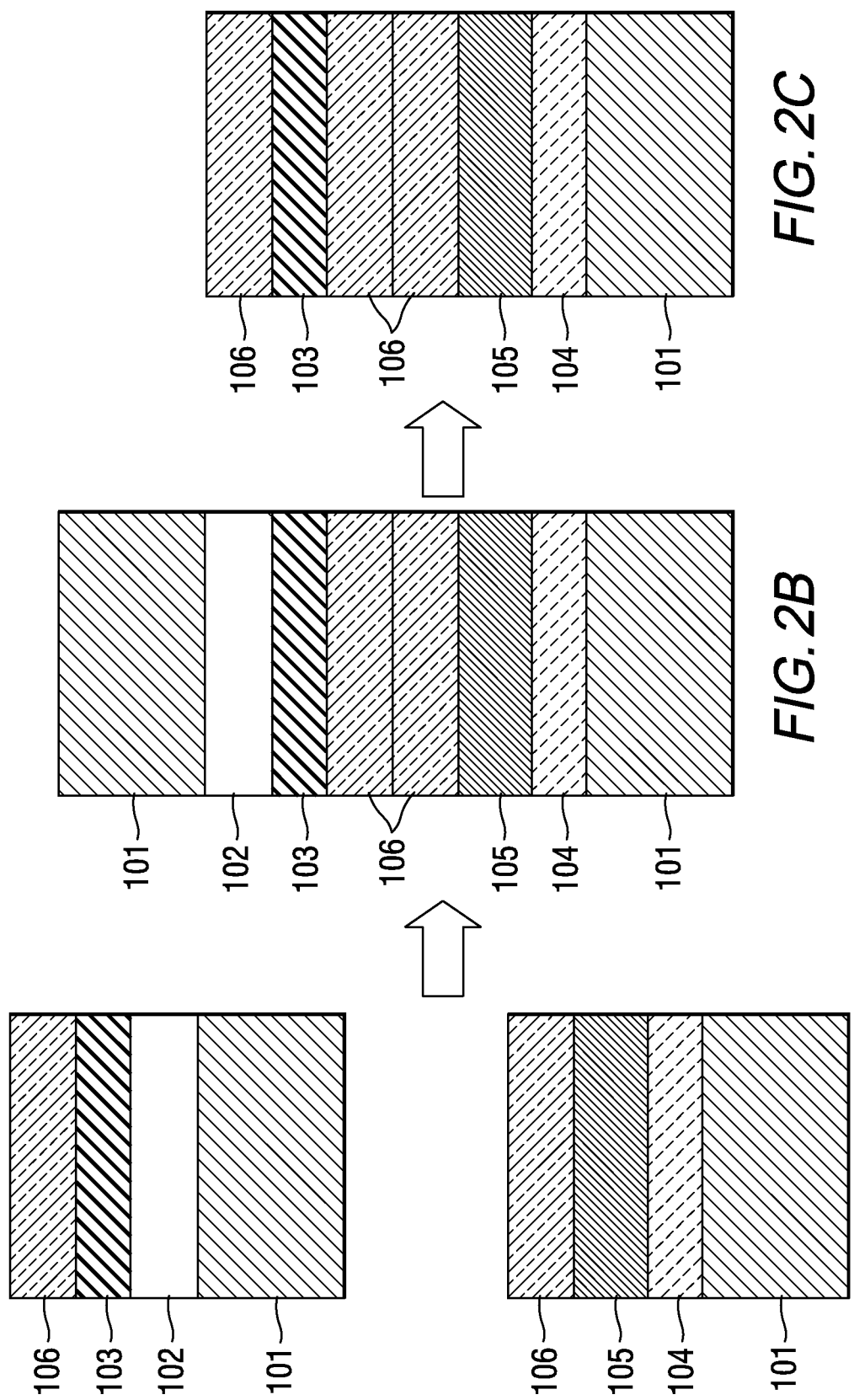
FIGS. 2A-2C show a schematic of a flow process of combining two substrates

In the example embodiment of FIGS. 2A to 2C, only LV devices include oxide between the device plane and the bulk substrate material. Thus, the lower substrate 101 in FIG. 2A has HV devices 104 formed directly on bulk substrate material, and has memory devices 105 formed on the HV devices 104. The LV devices plane 103 is flipped and aligned with the HV/memory wafer 104/105, aligned and bonded (FIG. 2B). Bulk substrate material can be removed from the LV side of the combined substrate until reaching the layer of dielectric 102. Then this uncovered layer of oxide can be converted into a metal routing layer (wiring plane) 106 (FIG. 2C).

Figure 3:
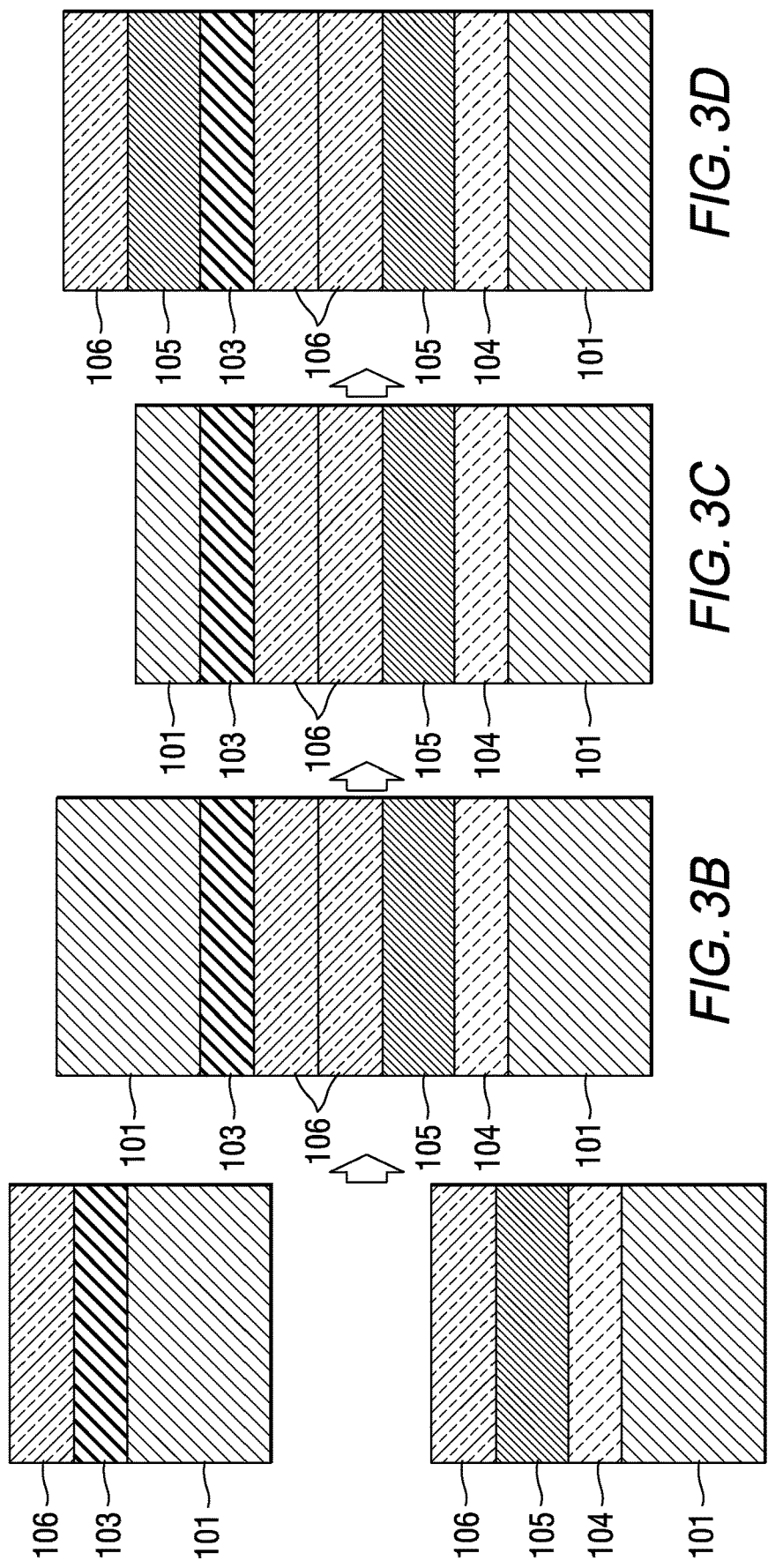
FIGS. 3A-3D show a schematic of a flow process of combining two substrates
Figure 4:
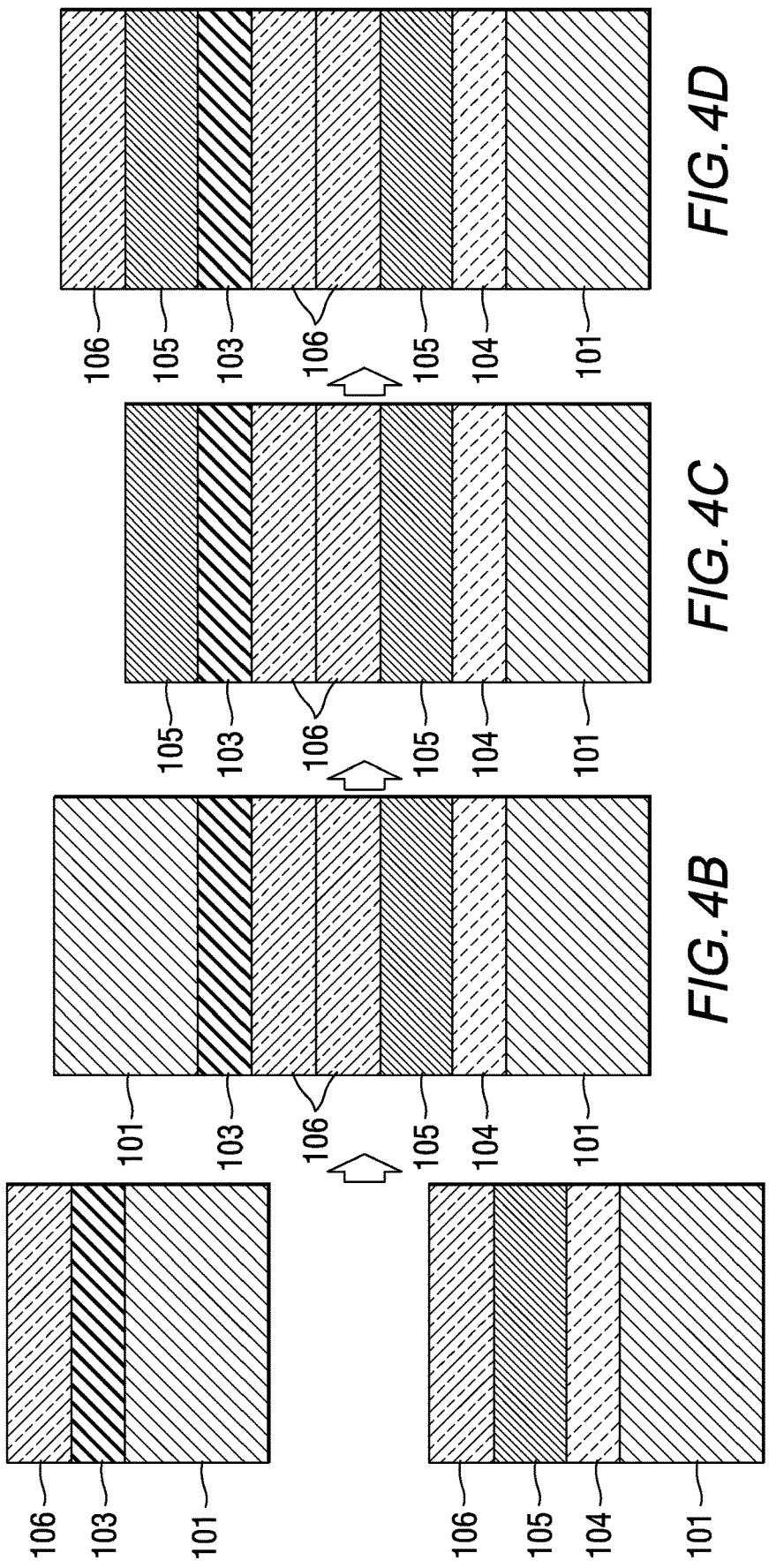
FIGS. 4A-4D show a schematic of a flow process of combining two substrates

The example embodiment of FIGS. 3A to 3D is similar to FIGS. 2A to 2C, except that neither substrate in FIG. 3A has a layer of dielectric separating HV and LV devices from the bulk substrate material. The LV substrate 101 is flipped, aligned, and bonded with the HV substrate 101 (FIG. 3B). In FIG. 3C, the bulk substrate material of the LV side is reduced in thickness. In FIG. 3D, the remaining substrate material is converted to a low-temperature memory 105, and then a wiring plane 106 is formed thereon. The flow in FIGS. 4A to 4D shows that the low-temperature memory is optional.

Figure 5:
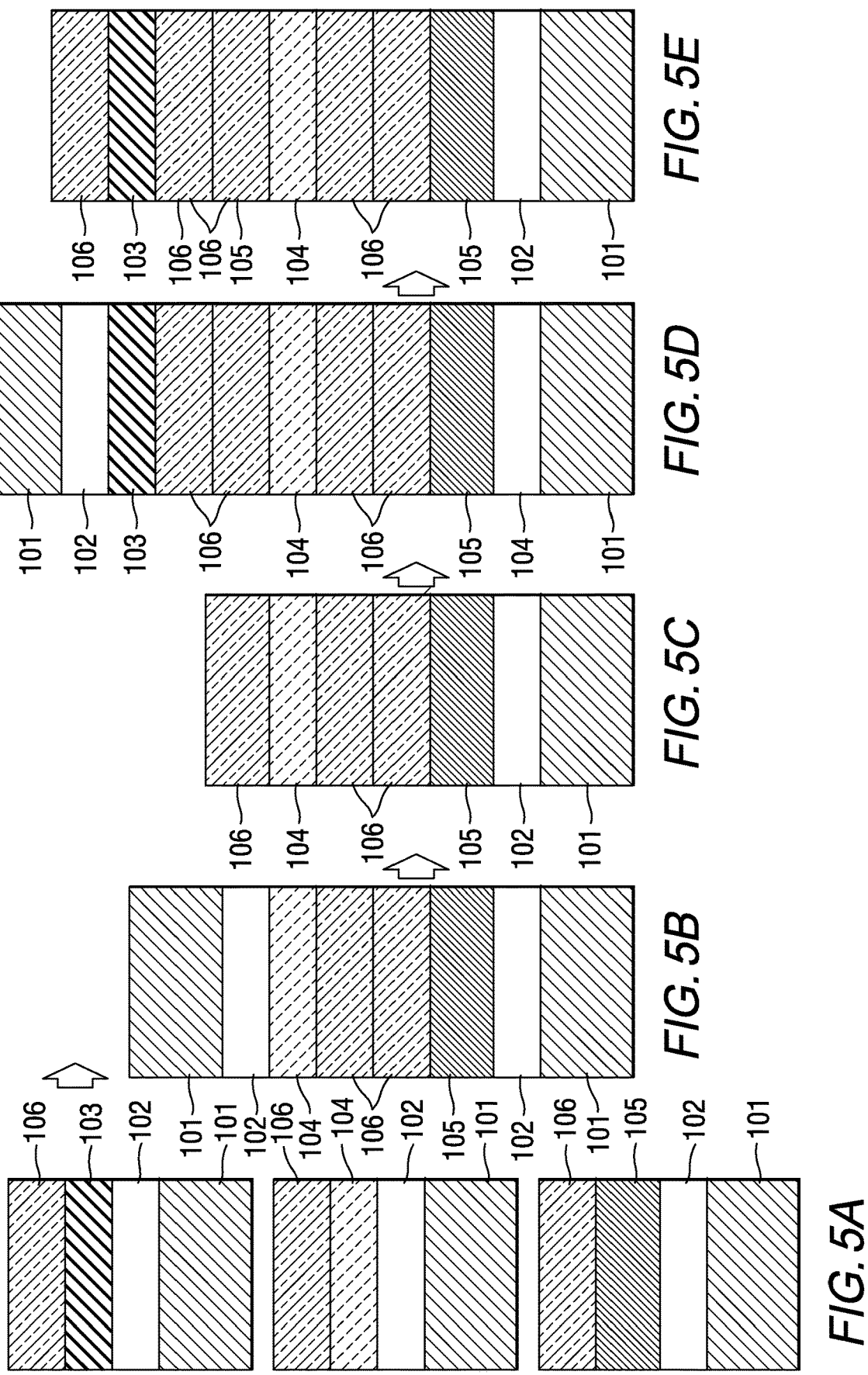
FIGS. 5A-5E show a schematic of a flow process of combining three substrates

The example embodiment of FIGS. 5A to 5E shows separate wafers for HV, LV, and Memory, with oxide between devices and substrates. Note that the stack order herein is exemplary and any order can be used. FIG. 5A shows three incoming substrates. The HV device substrate can be flipped and aligned and bonded to the memory device substrate (FIG. 5B). Bulk substrate material can be removed from the HV device side, and the dielectric layer converted into a metal routing/wiring plane (FIG. 5C). In FIG. 5D, the LV substrate is flipped and aligned with the newly-formed metal routing layer and bonded thereon. The LV device side can then have bulk substrate material removed and then have the oxide layer converted into a routing layer (FIG. 5E). Accordingly, many different combinations herein are contemplated.

Figure 6:
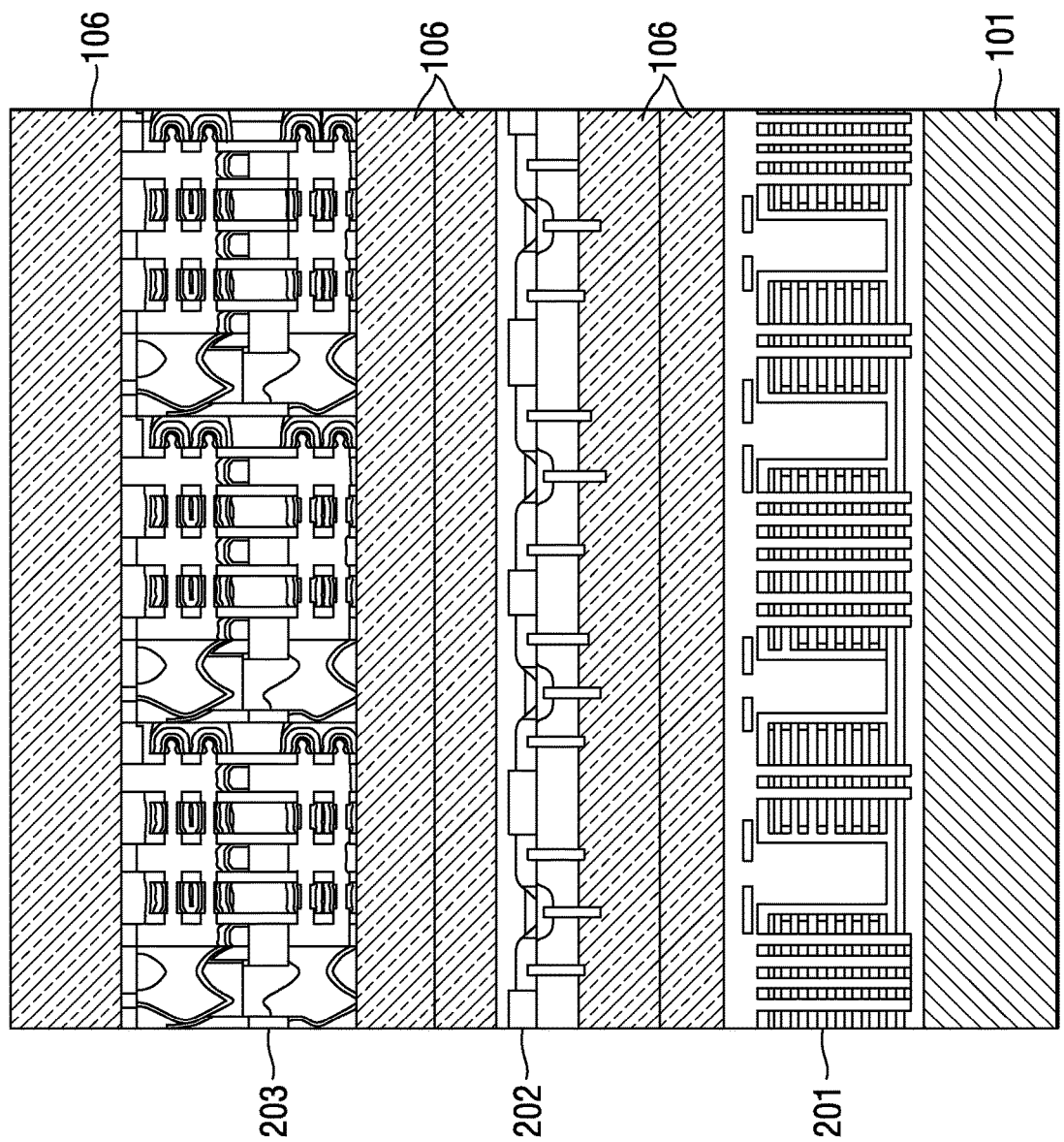
FIG. 6 shows a schematic of a cross sectional substrate segment having a 3D NAND memory, HV 2D planar devices and LV 3D nano-sheet devices
Figure 7:
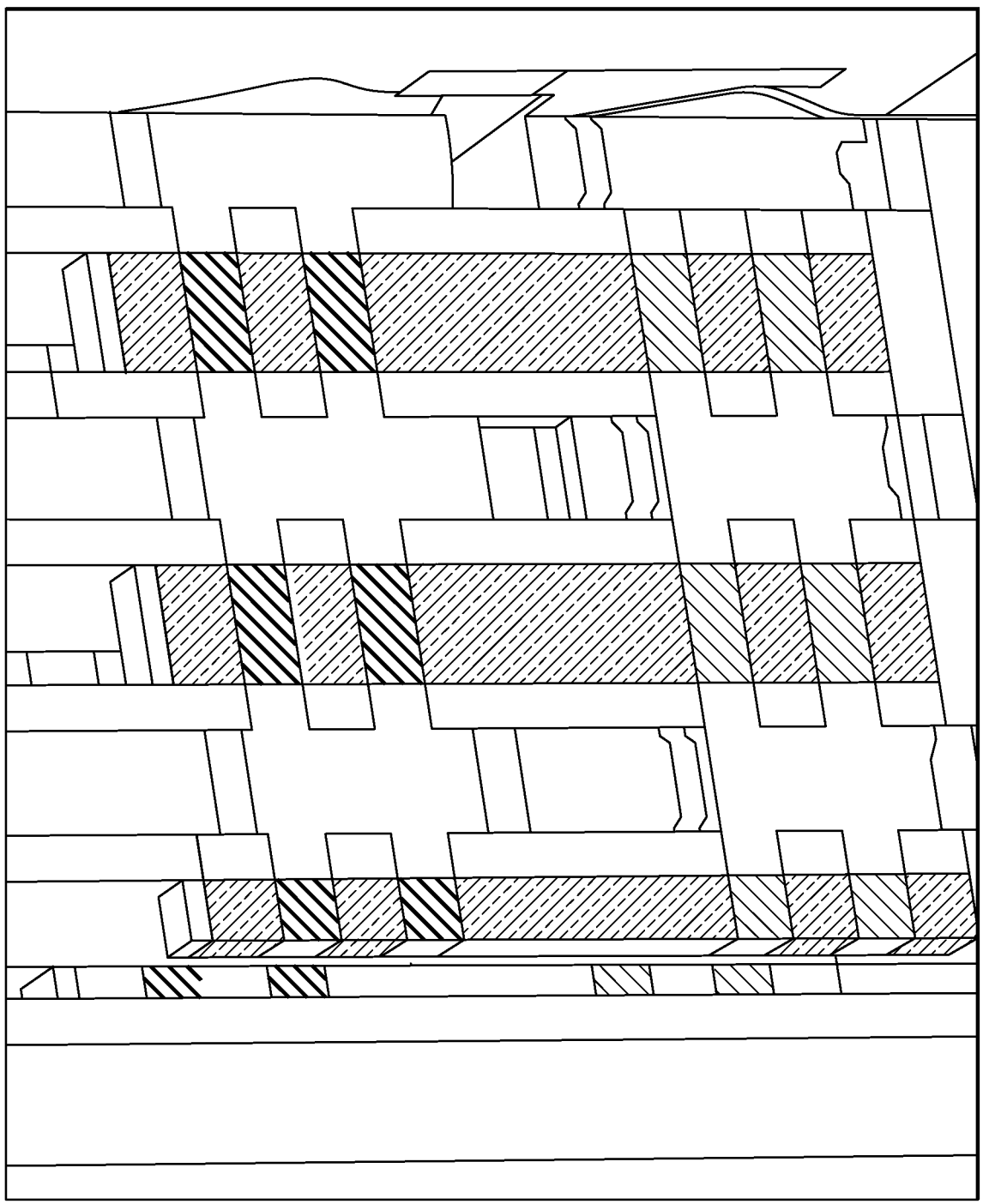
FIG. 7 shows a schematic of an LV CFET NMOS on top of a PMOS wafer

FIG. 6 shows an example cross-sectional substrate segment with a 3D NAND memory 201, HV 2D planar devices 202 and LV 3D nano-sheet devices 203. FIG. 7 shows an example LV CFET flow NMOS on top of a PMOS wafer. Etching using vapor phase etchants can have an etch rate of silicon 303 and SiGe1 302 greater than SiGe2 301. SiGe2 is removed to leave behind silicon nano-sheet NFET and SiGe1 nano-sheet PFET.

Figure 8:
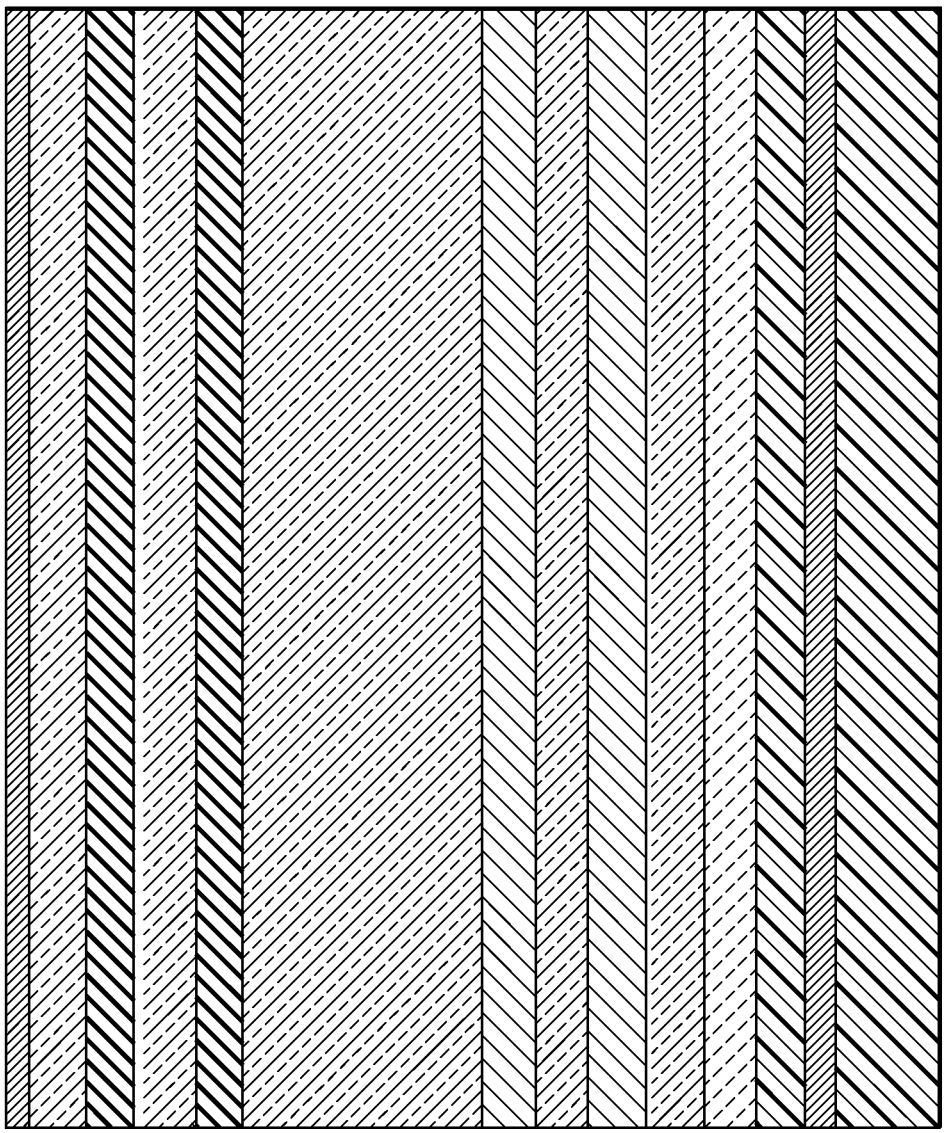
FIG. 8 shows a schematic of an epitaxial stack with oxide beneath the epitaxial stack

FIG. 8 is an example creation of an epitaxial stack with oxide beneath the epitaxial stack. This stack can be used to form LV 3D devices. In this process, SiGe2 layers 302 are removed between Si or SiC nano-sheets 303 to form NFET. SiGe2 layers 302 are removed between SiGe1 nano-sheets 301 to from PFET all at a same time. 304 is SiGe3 or Ge. 306 is Si substrate and 305 is oxide. This works for transistor stacks comprising the same type of transistors and also transistor stacks comprising different types of transistors. N to N+1-nano-sheets can be created.

Figure 9:
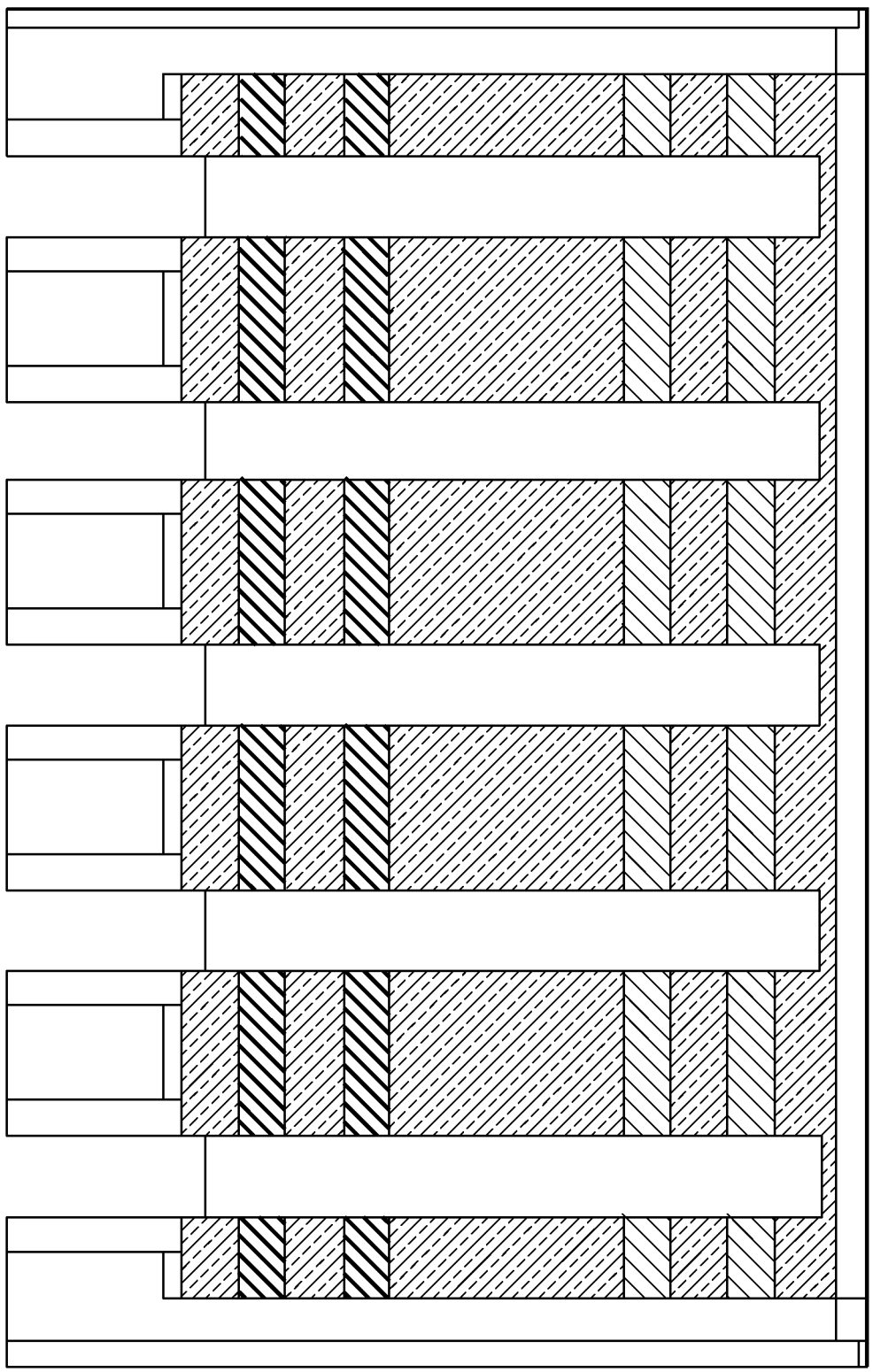
FIGS. 9-12 show a schematic of a flow process of creating a CFET source/drain recess module
Figure 10:
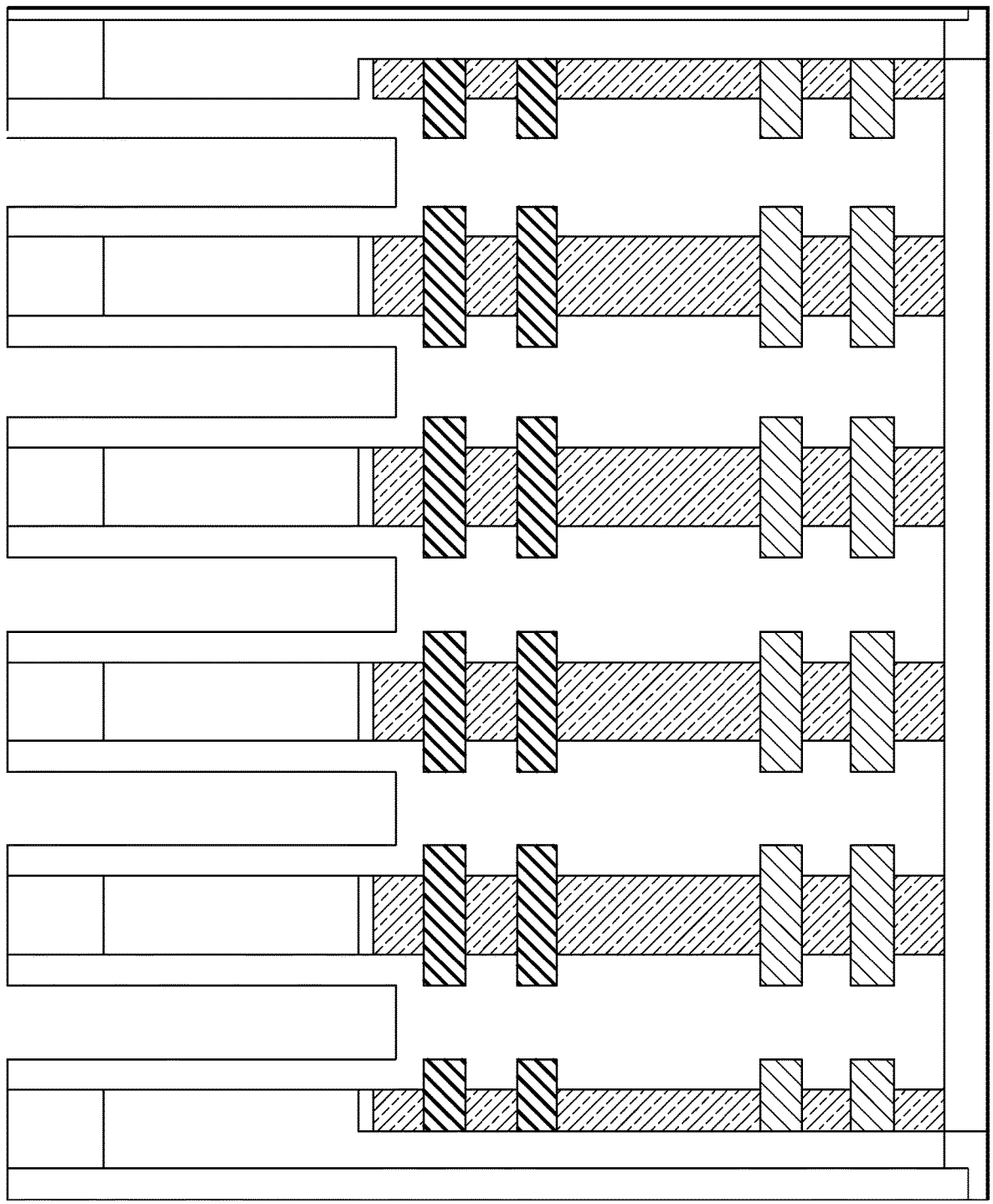
Figure 11:
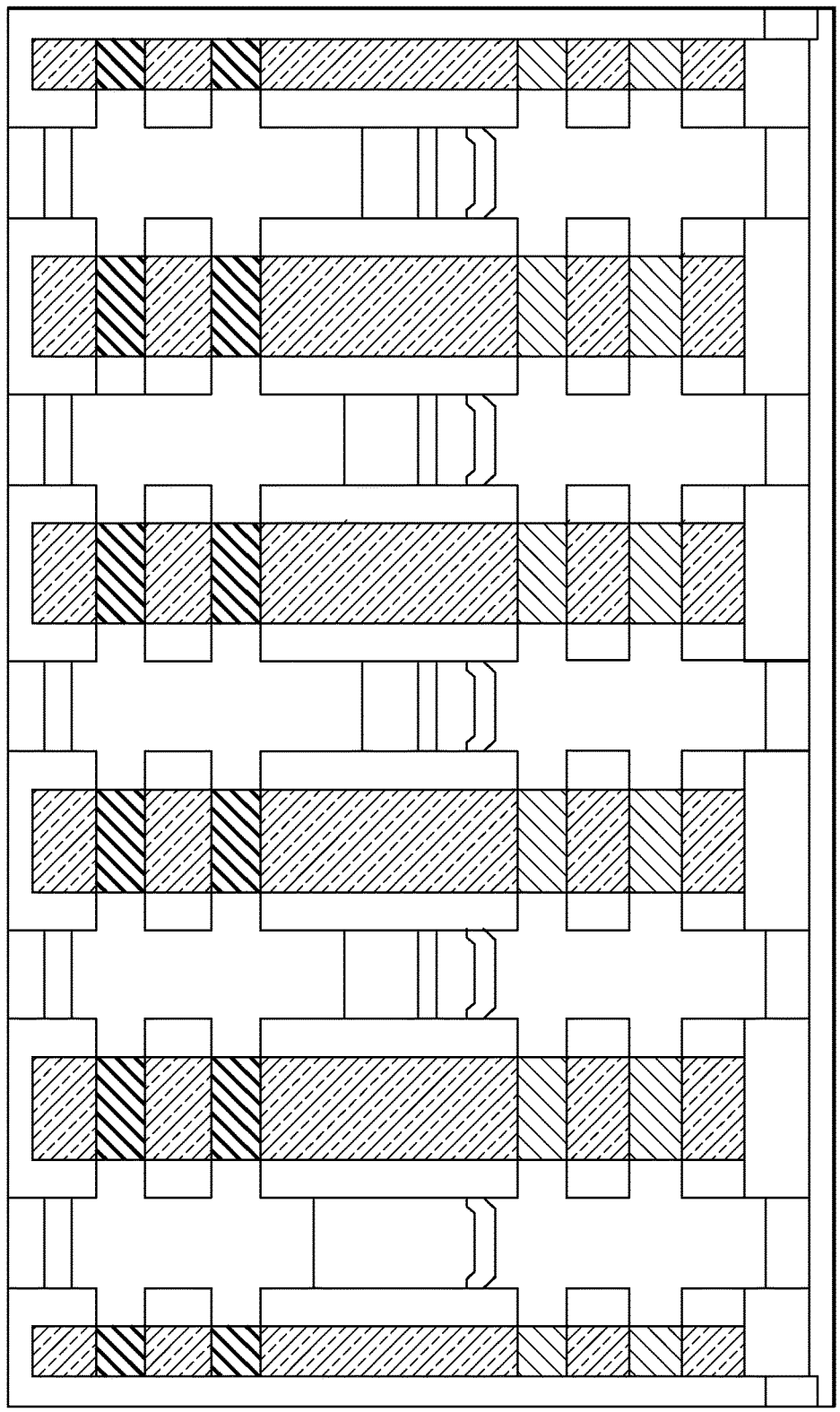
Figure 12:
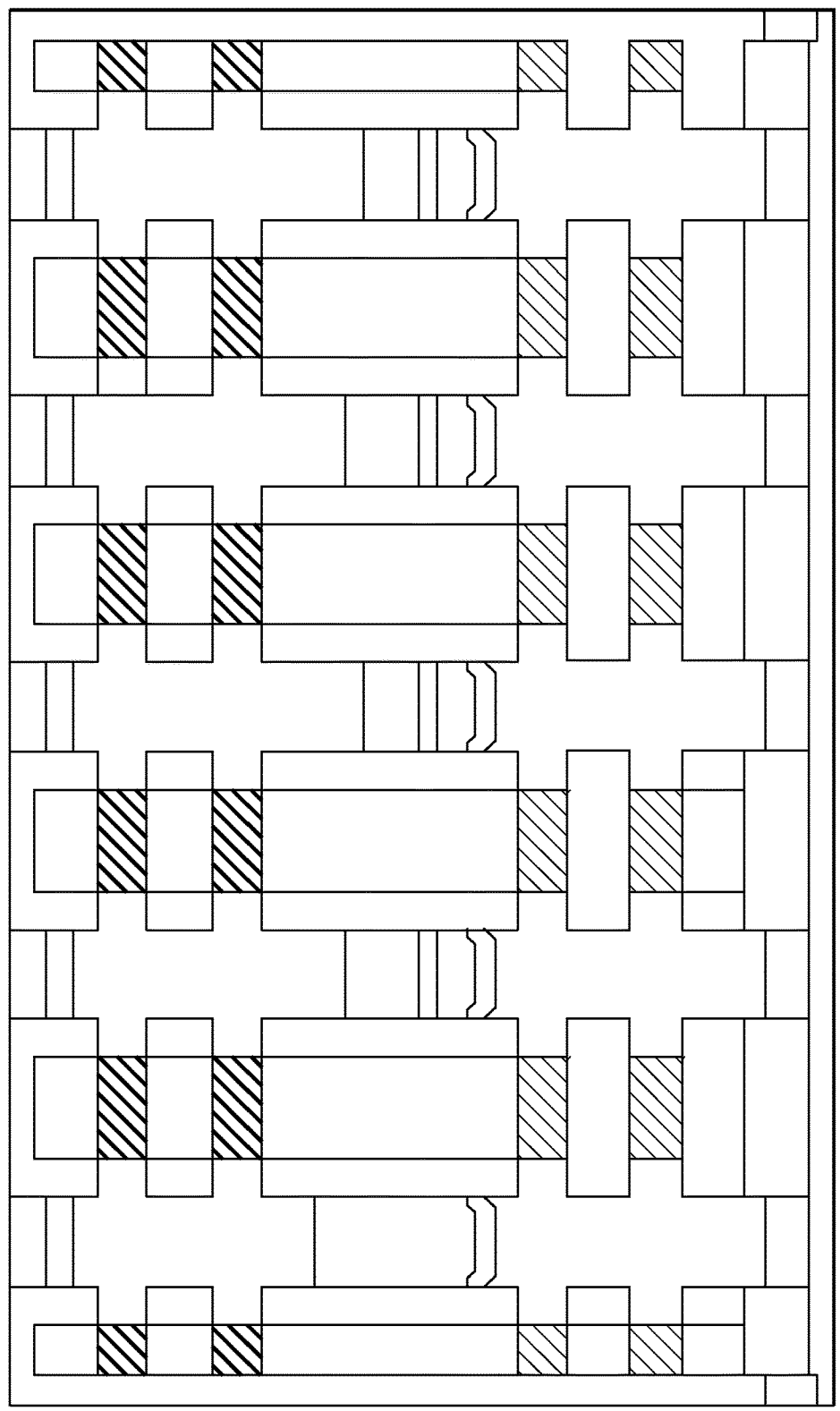

FIG. 9 shows a start of a CFET source/drain recess module. FIG. 10 shows a start of the CFET inner spacer module—etching SiGe2 indentation. An etch rate of SiGe1 can be much greater than SiGe2. Note that etchants and etch conditions are known and can be executed on vapor-phase etch tools such as Certas available from Tokyo Electron Limited. FIG. 11 shows start of replacement metal gate process and P-work function metal module. In FIG. 12, after removal of SiGe2 nano-sheets to release Si or SiC and SiGe1 channels for N/P FETs respectively.

Figure 13B:
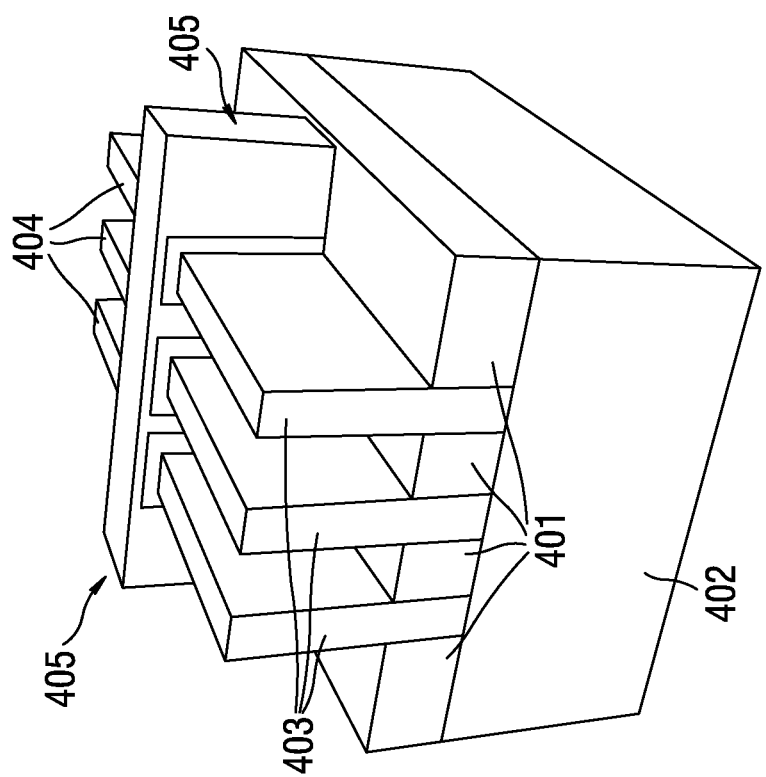
FIGS. 13A and 13B show perspective views of segments of HV and LV fin devices
Figure 13A:
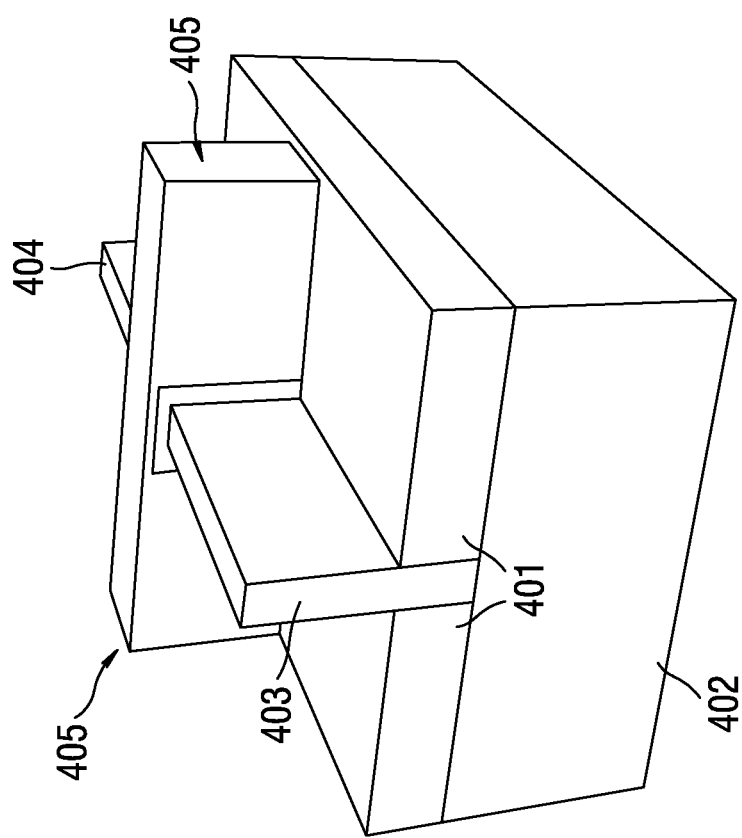
Figure 14:
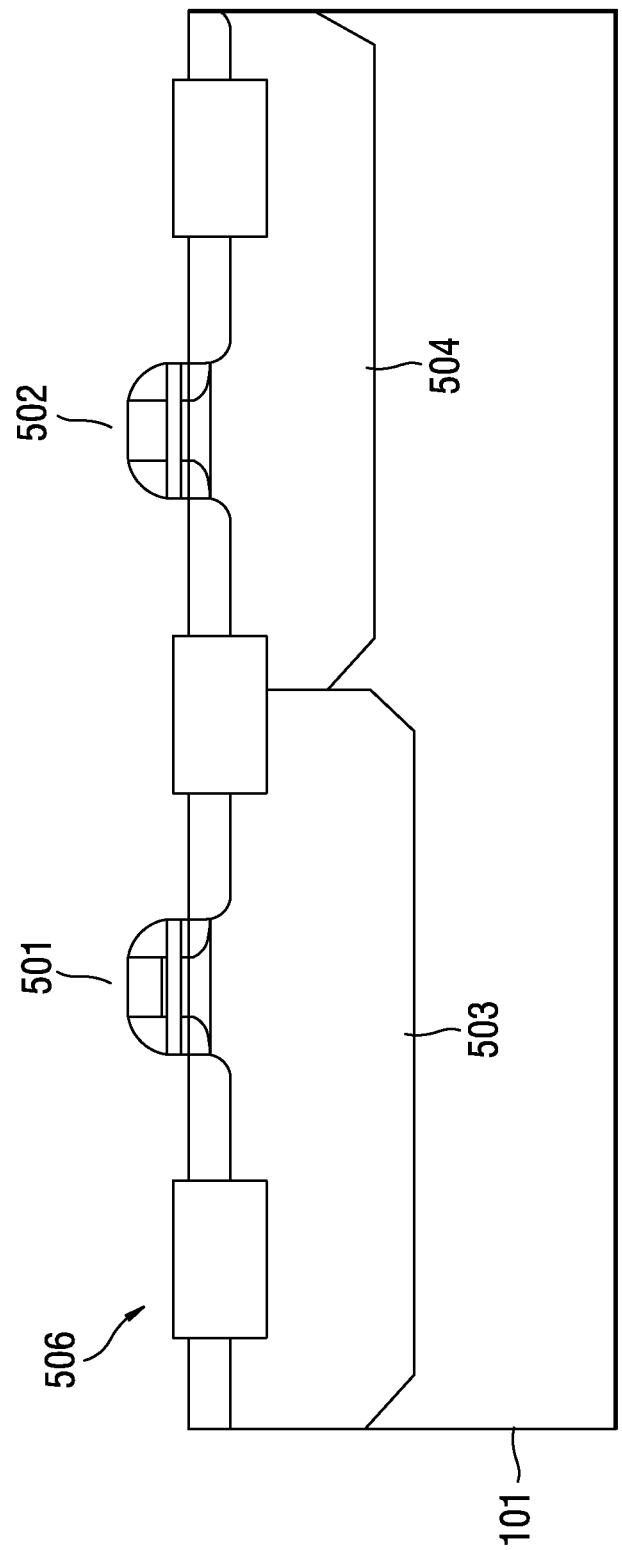
FIG. 14 shows a cross section view of a HV planar transistor on one wafer.

FIGS. 13A and 13B show perspective views of segments of example high-voltage and low-voltage fin devices that can be used herein, where 401 is oxide, 402 is silicon substrate, 403 is source, 404 is drain and 405 is gate. These finFET devices are conventionally known. FIG. 14 is an example cross section of a HV planar transistor on one wafer, where 501 is an NMOS, 502 is a PMOS, 503 is P-well, 504 is N-well, 505 is the substrate and 506 is a trench isolation.

Figure 18:
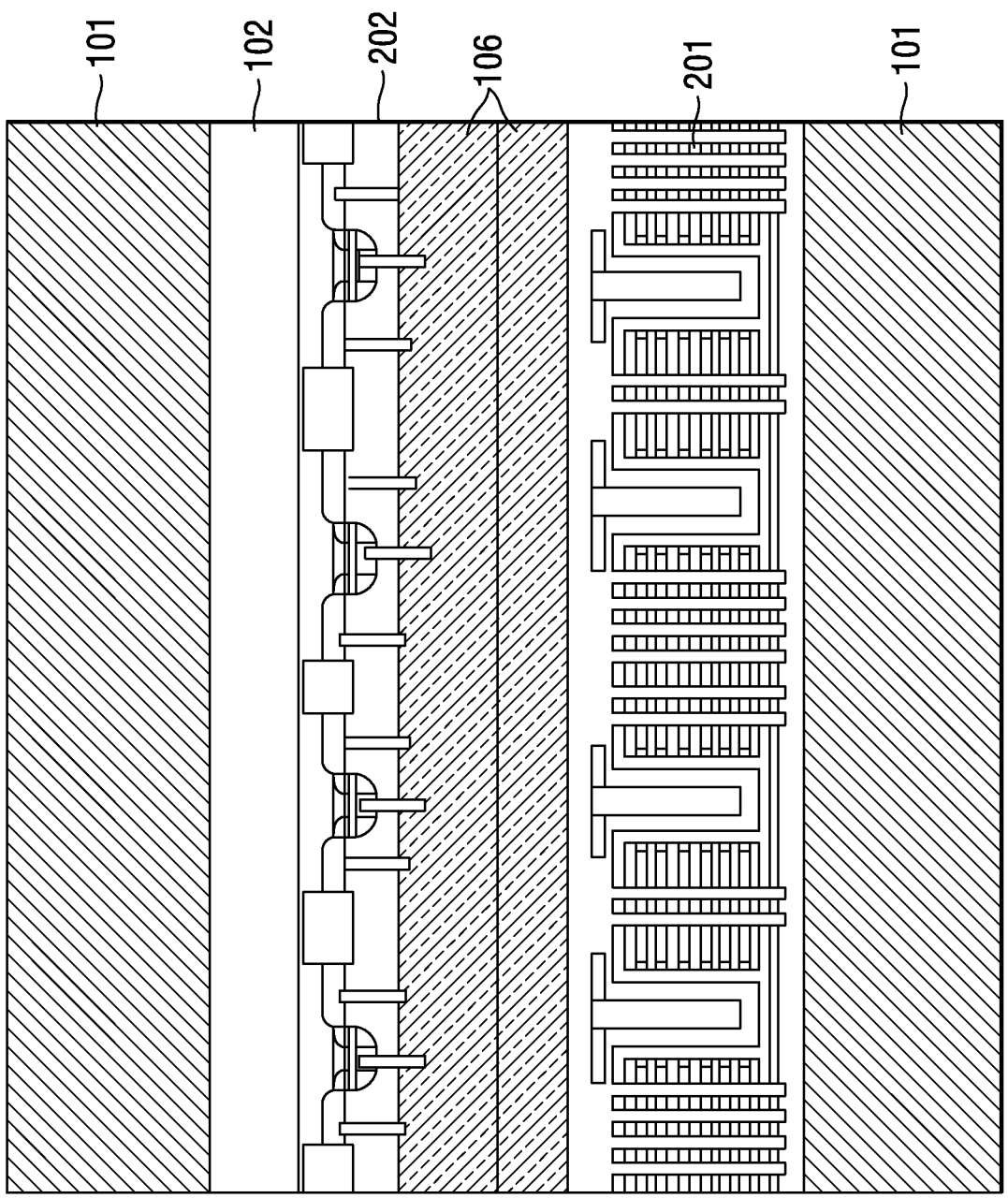
FIG. 18 shows a schematic of a bonding of an HV substrate to a memory wafer
Figure 19:
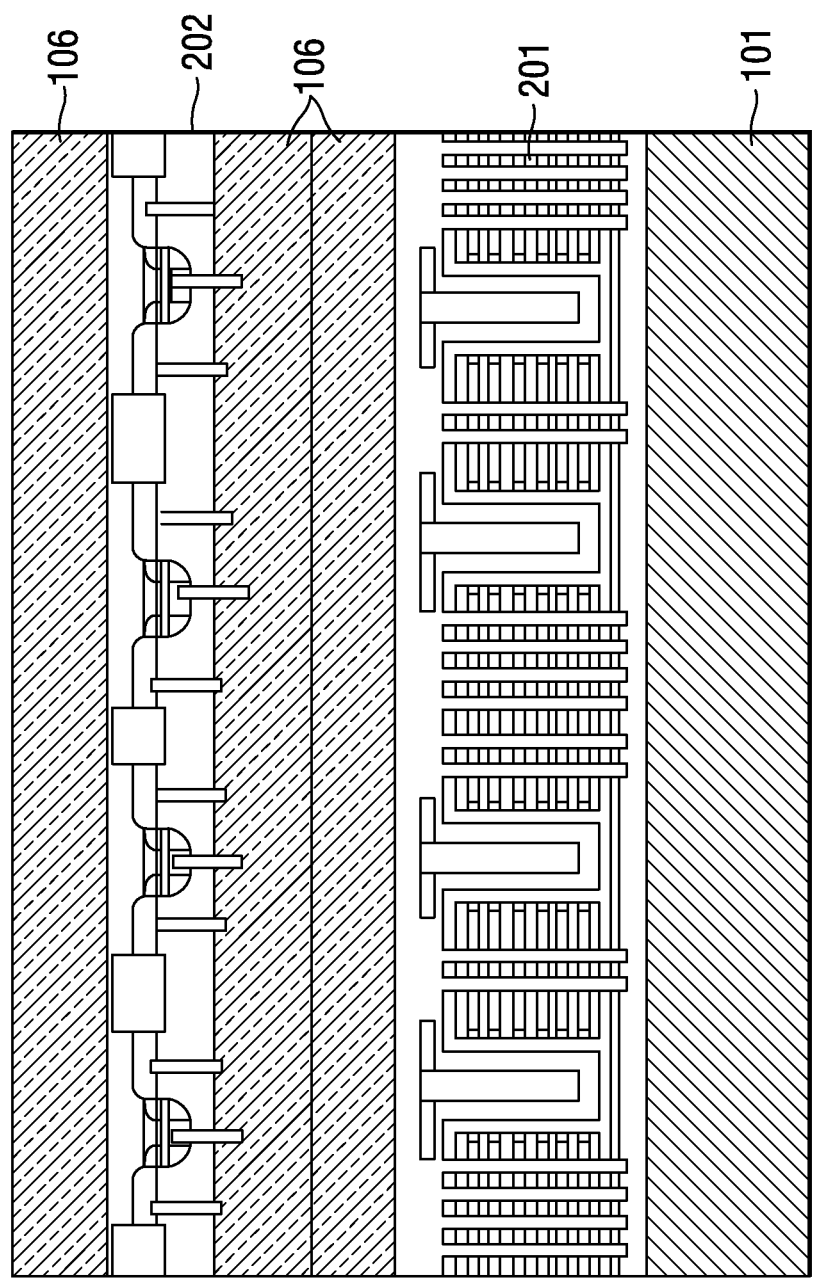
FIG. 19 shows a schematic of the HV substrate bonded to a memory wafer of FIG. 18, with the top surface removed and the oxide layer converted to a wiring layer
Figure 20:
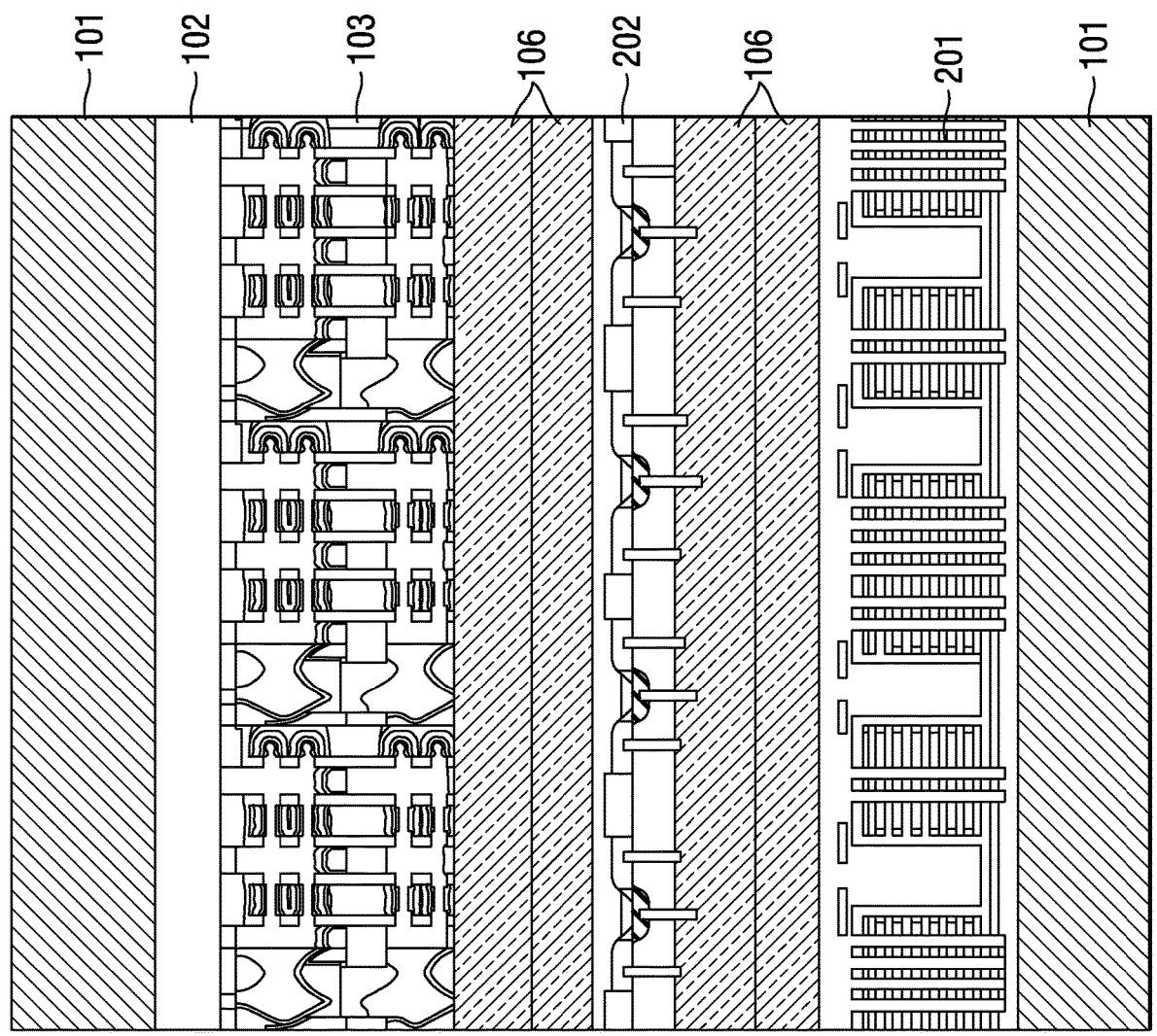
FIG. 20 shows a schematic of a bonding of an LV wafer to a memory wafer
Figure 21:
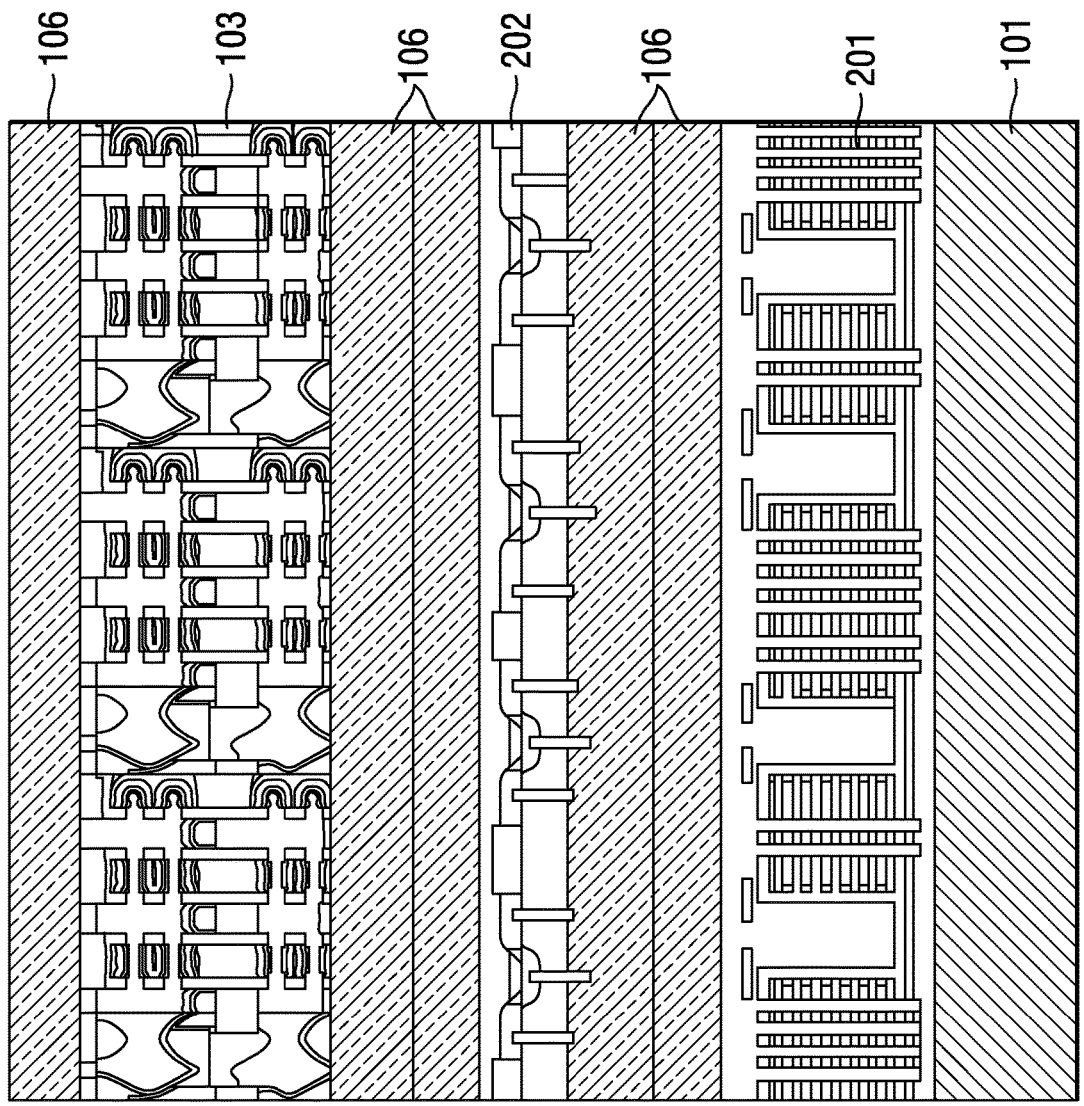
FIG. 21 shows a schematic of the HV substrate bonded to a memory wafer of FIG. 20, with the top surface removed and the oxide layer converted to a wiring layer
Figure 22:
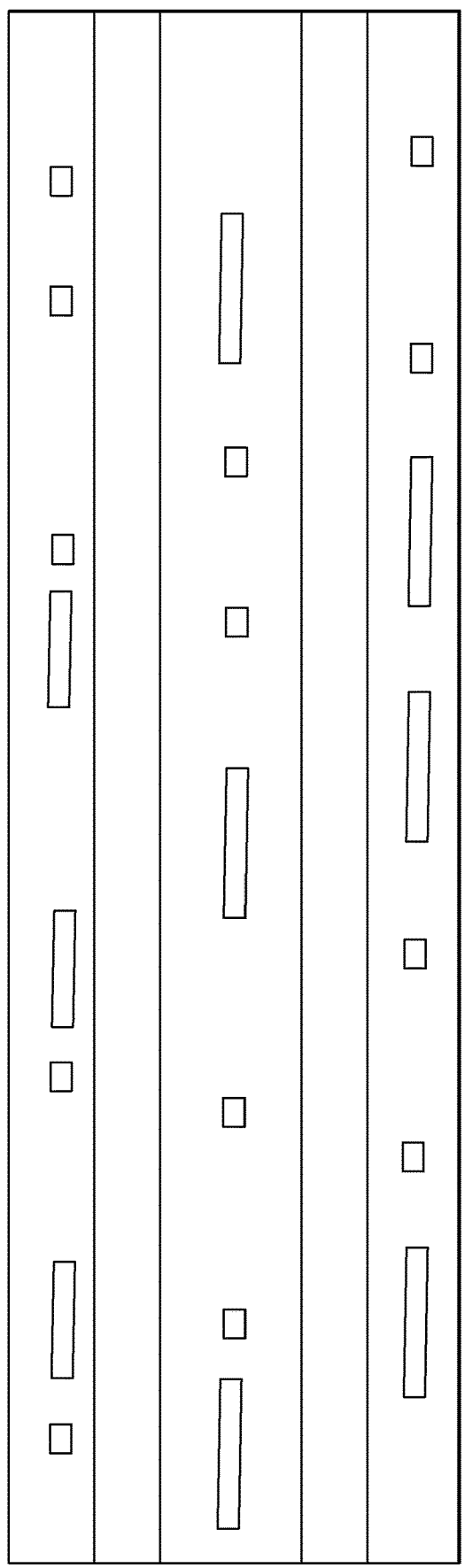
FIG. 22 shows a schematic of a PMOS with power rails added in the middle

FIGS. 15A and 15B show an LV wafer complete through metal x routing. A nano-sheet 203 example is shown. In FIGS. 16A and 16B, an HV wafer 202 is shown complete through metal x routing (having a planer device). In FIGS. 17A and 17B, a substrate with memory devices (NAND memory) 201 is shown though metal x routing. In FIG. 18, the HV substrate 202 is flipped and bonded to the memory wafer 201. A top surface is removed and oxide is converted to a wiring layer (FIG. 19). The LV wafer 103 is flipped and bonded to the stack (FIG. 20). In FIG. 21, a top of the stack is removed and the uncovered oxide is converted to a wiring plane. FIG. 22 shows that power rails can be added down a middle of the PMOS, and can be "buried" below active devices. This rail can be used for ground or power to the NFET or PMOS. Connections can be made from FET to rail for each metal x layer.

Accordingly, maximum performance can be achieved by processing LV, HV and memory on different substrates at different processing conditions (e.g., annealing temperatures) to achieve optimum devices, and then combined into a substrate stack for higher performance devices.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a circuit, the method comprising:
on a first substrate that has a front side opposite a backside, forming a first dielectric layer on the front side, forming low-voltage devices on the first dielectric layer, and forming a first wiring plane above the low-voltage devices;
on a second substrate that has a front side opposite a backside, forming high-voltage devices on the front side, forming memory devices above the high-voltage devices, and forming a second wiring plane above the memory devices; and
aligning the first wiring plane to be in contact with the second wiring plane and joining the first substrate with the second substrate to form a combined substrate.

2. The method of claim 1, wherein
on the second substrate that has a front side opposite a backside, before forming the high-voltage devices on the first side, forming a second dielectric layer on the front side, forming the high-voltage devices on the second dielectric layer, then forming the memory devices above the high-voltage devices, and forming the second wiring plane above the memory devices.

3. The method of claim 1, further comprising removing bulk substrate material from the backside of the first substrate until uncovering the first dielectric layer.

4. The method of claim 3, further comprising forming a third wiring plane using the first dielectric layer.

5. The method of claim 1, wherein forming includes using different annealing temperatures on the first substrate compared to the second substrate.

6. The method of claim 1, wherein the low-voltage devices include three-dimensional (3D) devices, stacked devices, or lateral gate-all-around devices.

7. The method of claim 1, wherein the forming of first and second wiring planes includes depositing oxide, using a photo mask to etch trenches and vias or adding contacts.

8. The method of claim 1, wherein the high-voltage devices include planar or FinFET devices.

9. A method of forming an integrated circuit, the method comprising:
- on a first substrate that has a front side opposite a backside, forming low-voltage devices on the front side, and forming a first wiring plane above the low-voltage devices;
- on a second substrate that has a front side opposite a backside, forming high-voltage devices on the front side, forming first memory devices above the high-voltage devices, and forming a second wiring plane above the first memory devices; and
- aligning the first wiring plane to be in contact with the second wiring plane and joining the first substrate with the second substrate to form a combined substrate.

10. The method of claim 9, further comprising:
- reducing a thickness of bulk substrate material from the first substrate;
- converting remaining bulk substrate material of the first substrate to a first dielectric layer; and
- forming a third wiring plane using the first dielectric layer.

11. The method of claim 9, further comprising:
- reducing a thickness of bulk substrate material from the first substrate;
- forming second memory devices using remaining bulk substrate material of the first substrate; and
- forming a fourth wiring plane above the second memory devices.

12. The method of claim 9, wherein forming includes using different annealing temperatures on the first substrate compared to the second substrate.

13. The method of claim 9, wherein the low-voltage devices include three-dimensional (3D) devices, stacked devices, or lateral gate-all-around devices.

14. The method of claim 9, wherein the forming of first and second wiring planes includes depositing oxide, using a photo mask to etch trenches and vias or adding contacts.

15. A method of forming a circuit, the method comprising:
- on a first substrate that has a front side opposite a backside, forming a first dielectric layer on the front side, forming low-voltage devices on the first dielectric layer, and forming a first wiring plane above the first low-voltage devices;
- on a second substrate that has a front side opposite a backside, forming a second dielectric layer on the front side, forming high-voltage devices on the second dielectric layer, and forming a second wiring plane above the high-voltage devices; and
- on a third substrate that has a front side opposite a backside, forming a third dielectric layer on the front side, forming memory devices on the third dielectric layer, and forming a third wiring plane above the memory devices;
- aligning the third wiring plane to be in contact with the second wiring plane and joining the third substrate with the second substrate to form a combined substrate;
- removing bulk substrate material from the backside of the second substrate until uncovering the second dielectric layer;
- forming a fourth wiring plane using the first dielectric layer; and
- aligning the second wiring plane to be in contact with the fourth wiring plane and joining the first substrate with the combined substrate.

16. The method of claim 15, wherein forming includes using different annealing temperatures on the first substrate, second substrate and third substrate.

17. The method of claim 15, wherein the low-voltage devices include three-dimensional (3D) devices, stacked devices, or lateral gate-all-around devices.

18. The method of claim 15, wherein the forming of first, second and third wiring planes includes depositing oxide, using a photo mask to etch trenches and vias or adding contacts.

19. The method of claim 15, wherein the order of stacking the first, second and third substrates is different.

20. The method of claim 15, wherein the forming a fourth wiring plane comprises:
- reducing a thickness of bulk substrate material from the first substrate;
- converting remaining bulk substrate material of the first substrate to the first dielectric layer; and
- forming the fourth wiring plane using the first dielectric layer.

* * * * *